United States Patent [19]

Womack, Jr. et al.

[11] Patent Number: 4,845,308

[45] Date of Patent: Jul. 4, 1989

[54] SUPERCONDUCTING ELECTRICAL CONDUCTOR

[75] Inventors: Edgar A. Womack, Jr., Akron, Ohio; Paul S. Ayres, Forest, Va.

[73] Assignee: The Babcock & Wilcox Company, New Orleans, La.

[21] Appl. No.: 75,180

[22] Filed: Jul. 20, 1987

[51] Int. Cl.$^4$ .................. H01B 12/00; H01L 39/24
[52] U.S. Cl. ............................. 174/15.4; 29/599; 174/125.1; 427/62; 439/427; 505/886; 505/887; 505/917; 505/925; 505/926
[58] Field of Search ............. 174/15 S, 126 S; 29/599; 505/812, 819, 886, 887, 884, 885, 917, 925, 926, 927; 427/62; 439/427; 156/47

[56] References Cited

U.S. PATENT DOCUMENTS

| | | | |
|---|---|---|---|
| 3,502,783 | 3/1970 | Aupoix et al. | 174/15 S |
| 3,594,226 | 7/1971 | Thomas | 427/62 X |
| 3,897,542 | 7/1975 | Economy et al. | 505/812 X |
| 3,946,141 | 3/1976 | Schmidt | 174/15 S X |
| 4,013,333 | 3/1977 | Chang | 439/427 X |
| 4,039,740 | 8/1977 | Iwata | 174/15 S |
| 4,092,194 | 5/1978 | Green | 427/376.2 X |
| 4,176,238 | 11/1979 | Vulis et al. | 174/15 S |
| 4,552,786 | 11/1985 | Berneburg et al. | 427/249 |
| 4,580,524 | 4/1986 | Lackey, Jr. et al. | 118/725 |
| 4,581,478 | 4/1986 | Pugh et al. | 174/DIG. 7 X |
| 4,650,775 | 3/1987 | Hill | 162/152 X |
| 4,657,776 | 4/1987 | Dietrich et al. | 427/62 X |
| 4,762,754 | 8/1988 | Nellis et al. | 228/107 X |

OTHER PUBLICATIONS

Jin, S.; et al.; "Fabrication of Dense Ba$_2$YCu$_3$O$_{7-6}$ Superconductor Wire by Molten Oxide Processing"; Applied Physics Lett. 51, (12); Sep. 21, 1988; American.

*Primary Examiner*—Morris H. Nimmo
*Attorney, Agent, or Firm*—Vytas R. Matas; Robert J. Edwards; Daniel S. Kalka

[57] ABSTRACT

A superconducting electrical conductor comprises a porous substrate of bonded fibers which are coated by ceramic oxide superconducting material of the perovskite type so that its critical temperature of superconductivity is at or above the boiling point of liquid nitrogen. To form electrical cable, the conductor is encased within an inner tube. An outer tube surrounds the inner tube and defines an evacuated annular space therewith. This provides a thermal barrier between substrate, which will be bathed by liquid nitrogen, and the ambient. Electrical and heat insulation surrounds the outer tube. Joint connectors in the form of multiple rigid rods, each coated by superconducting material and held in a perforated frame, are used to connect facing ends of the substrate to form an electrical connection from one length of conductor to the next.

13 Claims, 2 Drawing Sheets

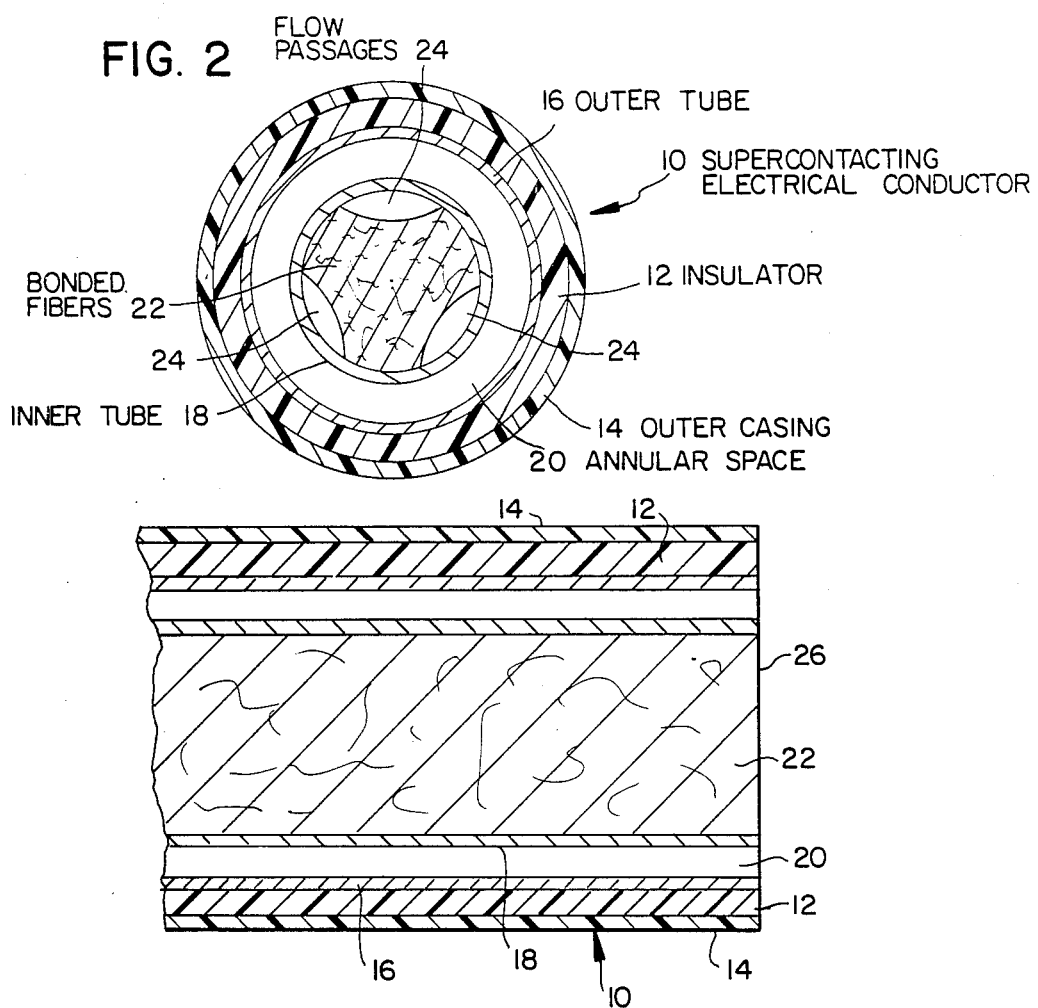
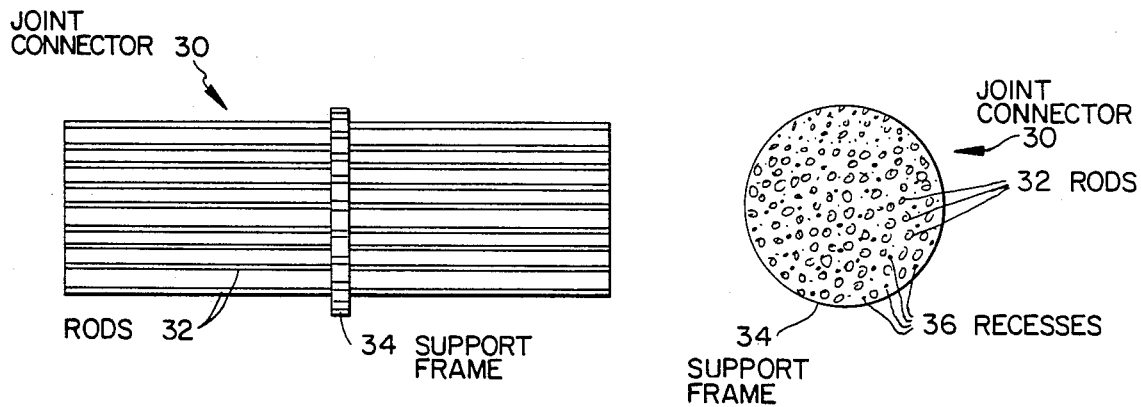

4,845,308

SUPERCONDUCTING ELECTRICAL CONDUCTOR

The present invention relates in general to superconductors, and in particular to a new and useful superconducting electrical conductor and method of making such a conductor and of making a cable from it. Until recently, superconductivity could only be reached at very low temperature which could only practically be achieved using liquid helium. This represented an enormous expense and rendered the use of such superconducting materials impractical for many potential applications where a low energy-loss conductor is desirable. Such applications include but are not limited to motors, generators, electrical power transmission lines, electrical storage devices, levitating trains and electromagnets for use in magnetic resonance imaging, fusion containment, particle accelerators, and ship propulsion.

Significant advances have recently been made to overcome this problem. Superconductors have now been discovered which have superconducting properties at or above temperatures which can be achieved by liquid nitrogen (about 77° K.). Ching-Wu Chu of the University of Houston has recently discovered that certain oxides of lanthanide rare earths, such as yttrium, have superconducting properties at around 98° K. (−284° F.).

A group of compounds which have superconducting properties at these and perhaps even higher temperatures, has the structure $RBa_2Cu_3O_{7-x}$, where R is yttrium or another lanthanide rare earth, and x is a number less than 1. The lanthanide rare earths are elements having atomic numbers 58 through 71. These compounds are known as triple-layer perovskites where some of the oxygen sites are vacant.

The number of oxygen atoms depends on the method used to prepare the material. See SCIENCE, *VOLUME 236*, "An Oxygen Key To The New Superconductors," pages 1063–1065, May 29, 1987. To vary the number of oxygen atoms per structural unit of the perovskite between 6.1 and 6.9, oxygen pressure in a high-temperature furnace during preparation of the compound is varied. The concentration can also be reversibly lowered and raised simply by first removing from and then reinserting oxygen atoms into linear chains of the perovskite by means of high temperature treatment (annealing) in vacuum and in air. The number of oxygen atoms strongly influences the critical temperature for superconductivity of these compounds, as well as their crystal structure.

While strides are being made in increasing the temperature at which superconductivity can be achieved, problems associated with actually fashioning a practical electrical conductor out of superconducting material remain.

One approach in making wires out of superconductive material is to embed filaments of the superconductive material into an electrically conductive matrix such as copper or copper alloy. See, for example, U.S. Pat. No. 4,079,187 to Fillunger et al, U.S. Pat. No. 4,377,032 to Benz and U.S. Pat. No. 4,489,219 to Sunaga et al. Some of these references also require drawing of the composite material into wire strands. These references all deal with niobium or niobium/tin alloy superconductors which become superconductive only at temperatures which can be reached by liquid helium. The use of an electrically conductive matrix was required to provide a continuous pathway in case the sometimes transient superconductor property lapses at any point along the line.

Another approach at providing a supplemental pathway, and at the same time, adding structural strength to the superconductor material is disclosed in U.S. Pat. No. 4,529,837 to Borden. Borden encases superconducting filaments in a cladding of copper. The copper clad wire is then bent to shape to form a so-called Rutherford-type superconductor cable.

Another approach in strengthening the mechanical characteristics of superconductors is disclosed in U.S. Pat. No. 3,594,226 to Thomas. This reference discloses the use of conductive carbon fibers which are coated by a niobium/tin superconductor alloy. Here again, however, the low temperature superconductors are used and a conductive substrate carries the superconductor material.

SUMMARY OF THE INVENTION

The present invention relates to a superconducting electrical conductor which utilizes ceramic oxides of the $RBa_2Cu_3O_{7-x}$ type which have a critical superconducting temperature at or above the temperature of liquid nitrogen.

The cable arrangement of the present invention includes a conductor comprising an elongated porous substrate of bonded fibers which are coated by the ceramic oxide superconducting material. The substrate is encased within an inner tube which is supplied with cryogenic or other suitable fluid for cooling the superconducting material.

Fluid passes easily through the spaces between the bonded fibers of the porous substrate; longer range longitudinal flow is assisted by the presence of flow passages formed on the circumference of the porous substrate. The cryogenic fluid is advantageously liquid nitrogen which can be supplied in a low flow (percolation) open cycle.

An outer tube surrounds the inner tube and defines a space which is evacuated for thermally insulating the inner tube from the ambient. An electrical and heat insulator is provided around the outer tube.

To connect lengths of conductor, a connector is used which comprises a plurality of rigid rods extending generally parallel to the direction of elongation of the porous substrate. The rods are each coated with superconducting material and are held in a central plate-shaped perforated frame. Opposite ends of the rod are thrust into exposed ends of the porous substrate of two adjacent conductors, for connecting the conductors together. The cryogenic fluid can easily pass from one conductor to another through the perforated frame.

To better insure the continuity of superconducting material, the area of the connection is chemically treated with additional superconducting material.

The invention also involves a method of making the superconducting conductor, of installing and chemically treating the conductor joints, and in further treating the conductor after installation.

The superconducting material can be deposited onto and into the porous substrate of bonded fibers using a variety of methods including chemical vapor deposition (CVD), evaporation deposition from liquid (or sol-gel) solution, deposition from a precursor laden fluid (including supercritical processes) and the like.

To achieve high critical current densities in the superconductor, it is also advantageous to coat the substrate fibers with materials of generally correct grain orientation. This may be done by forming the individual fibers so that the crystalline orientation on the fiber surface, prior to coating, encourages the superconductive material to develop grains with basal planes perpendicular to the fiber radius. The superconducting material is then applied to the fibers so as to produce epitaxial crystal formation in the desired orientation, i.e. basal planes perpendicular to the fiber radius. Other methods of encouraging correct grain orientation may also apply.

BRIEF DESCRIPTION OF THE DRAWINGS

In the drawings;

FIG. 2 is a sectional view of the cable arrangement in accordance with the present invention;

FIG. 3 is an axial sectional view of the cable arrangement shown in FIG. 2;

FIG. 4 is an axial elevational view of a joint connector made in accordance with the present invention;

FIG. 5 is a radial elevational view of the joint connector of FIG. 4;

DESCRIPTION OF THE PREFERRED EMBODIMENTS

Figure 1:
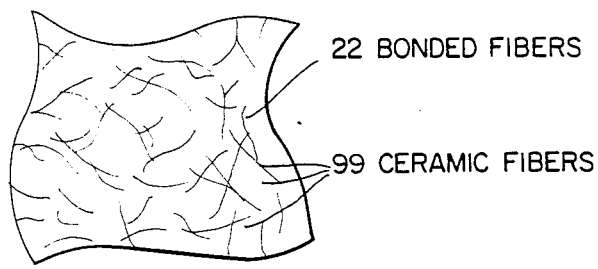
FIG. 1 is a plan view, showing the microstructure of the bonded fiber porous substrate.

Referring to the drawings, in particular, the invention embodied in FIGS. 2 and 3 comprise a superconducting cable arrangement generally designated 10 having an outer electrical/thermal insulator 12 made, for example, of expanded polystyrene or similar material, sealed within an outer polyvinyl chloride or similar material outer casing 14. Insulator 12 surrounds an outer metal tube 16 which, in turn, is spaced outwardly from an inner metal tube 18. An annular space 20 is defined between inner and outer tubes 16,18. This space is evacuated in accordance with the present invention to thermally isolate the inner superconducting structure from the ambient environment.

Enclosed within inner tube 18 is a highly porous substrate of bonded fibers 22 and liquid nitrogen flow passages 24. The microstructure of the bonded fibers is shown in FIG. 1. The fibers are advantageously ceramic fibers 99 which are sintered to bind the fibers together. The fibers are bound and connected to each other at a multiplicity of locations to produce continuous pathways along the substrate.

In accordance with the present invention, the substrate of bonded fibers is coated with superconducting material. This material thus forms a multiplicity of current pathways along the substrate.

One particularly advantageous material for making the porous substrate of bonded fibers is disclosed in U.S. Pat. No. 4,650,775 to Hill, which in incorporated here by reference. Hill discloses a bonded fibrous product which as high thermal insulating value, high modulus of rupture and low density. It is formed by blending aluminosilicate fibers, silica powder and boron nitride powder and then sintering the blend at a temperature of a least 2,350° F.

The aluminosilicate fibers may advantageously be a combination of SiO and $Al_2O_3$. One such combination is known by the brand name KAOWOOL and is manufactured by the Babcock and Wilcox Company.

Superconducting material of the general class of $RBa_2CU_3O_{7-x}$ type ceramic material, is deposited on the substrate. $RBa_2Cu_3O_{7-x}$ ceramic material is advantageous as a superconductor since its critical temperature for superconductivity is above the liquid nitrogen boiling temperature (of 77° K.).

The typical density of the bonded fibrous substrate 22 is 10%. This high porosity material has substantial space between the fibers of the substrate for the passage of the cryogenic liquid which, for reasons of economy and convenience is liquid nitrogen.

The superconducting material is applied in a layer of about one micron thickness. If a substrate of bonded fibers having a two inch diameter is used, this provides several sq. centimeters of effective cross section of superconducting material. This assumes the substrate material has an average surface area of approximately 1.5 sq. meters per gram and that the density of the material is approximately 20 lbs per cubic ft. This is typical for bonded fiber material of the type disclosed by the Hill patent.

To join lengths of superconducting cable of the type shown in FIGS. 2 and 3, a joint connector generally designated 30 in FIG. 4 is used. The joint connector comprises a plurality of slender rigid rods 32 which extend in the axial direction of the conductor, and which are held parallel to and spaced from each other in a support frame 34. As shown in FIG. 5, support frame 34 includes a multiplicity of apertures and recesses 36 which form flow passages for the cryogenic fluid. The rods 32 are fixed to frame 34 and held in areas between the flow passages 36.

The rods are coated with superconducting material as are the fibers of the substrate.

To assemble one end of a cable shown (for example, at 26 in FIG. 3) to a similar end of an adjacent cable, the rods 32 at one end of the connector 30 are thrust into the open end 26 of the substrate. The exposed end of another conductor is then thrust over the opposite ends of the rods 32.

To enhance establishment of multiple superconducting pathways across the joint connector, additional superconducting material may be chemically deposited into the joint area of the transmission line.

To achieve excellent connectivity of the microstructure in the connected line, a final, in-situ annealing of the superconductor material is needed. This may be at the sintering temperature. After conductor segments are installed in their metallic tubes with joint assemblies in place at the end of bulk conductor segments, additional superconductor material is chemically infiltrated through the conductor and joint spaces, and is deposited especially at the mechanical contact points between the joint rods and the bonded fibers of the substrate. External heating is then applied to raise the internal temperature of the conductor and joint within its insulated space to achieve the necessary thermal processing of the superconducting material.

The following two paragraphs describe an embodiment of the subject invention as applied to an electrical power transmission line.

Figure 6:
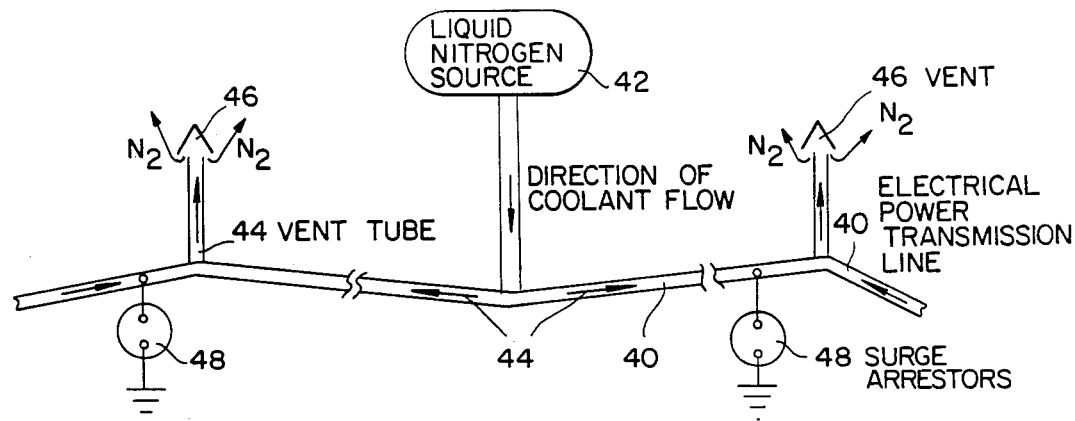
FIG. 6 is a schematic diagram showing a transmission line in accordance with one embodiment of the present invention including peripheral structures.

According to the present invention, high electrical currents can be transmitted over long distances with negligible energy loss. FIG. 6 shows an electrical power transmission line generally designated 40. A source of liquid nitrogen or other suitable cooling fluid, 42 is connected at a low point in the line to the interior of inner tube 18 to allow for an open cycle low flow (percolation) coolant operation. As the cooling fluid moves along the tubes in the direction of arrows 44, the superconducting material is maintained at or below its critical temperature. The spent cooling fluid, which may be all or partly in gaseous form at this point, is vented from vents 46 at high points in the transmission line 40.

To protect against damage which may be caused by quenching (inadvertent loss of superconductivity) high capacity surge arrestors 48 will be connected between the inner tube 18 and ground, at intervals along the transmission line. In the unlikely event that a segment of the line becomes normal conducting, the arrestors 48 will conduct the resulting energy build-up to earth in a controlled manner until current interrupt at the source is completed and the line's inductive energy is discharged.

In other embodiments of the invention, the superconducting material can be shaped into coils for use in other applications such as motors, generators and electromagnets.

Figure 7:
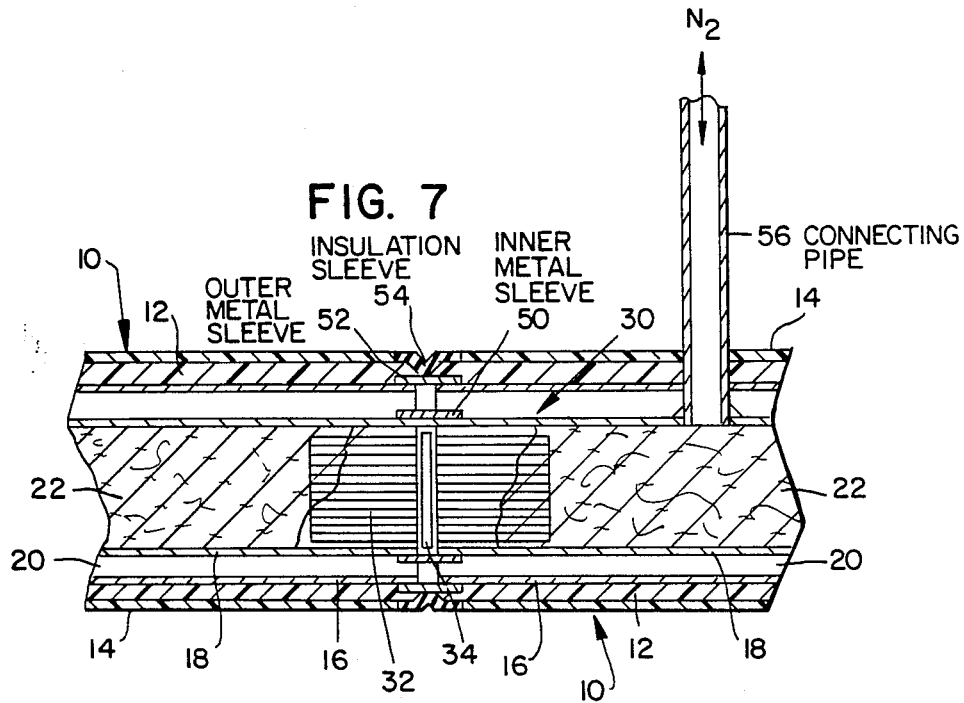
FIG. 7 is an axial sectional view showing the joint area between two cable conductors in accordance with the present invention.

FIG. 7 is an axial sectional view of a joint area. Once the joint connector 30 is installed, the ends of inner tubes 18 are bridged by a vacuum tight inner metal sleeve 50. An outer metal sleeve 52, also vacuum tight, is then connected between the outer tubes 16 and an insulation sleeve 54 is connected between the ends of the insulation of the conductors.

FIG. 7 also shows a connecting pipe 56 which is hermetically sealed to the inner and outer tubes 18 and 16 and which is used to convey liquid nitrogen, or other suitable cooling fluid, to or from the porous substrate. The connecting pipe is thus either connected to a source of liquid nitrogen 42 or a vent 46.

The superconductivity of the conductor can be maintained in a simple and economical manner and a secure structural support is provided for the otherwise brittle superconducting material.

The material of the inner and outer metal tubes must be capable of being annealed in-situ by the same thermal treatment that is used in depositing the additional superconducting material in the substrate, and must also have minimum chemical potential for altering the oxygen ratio of the superconducting material. Nickel or certain high nickel alloys are good choices.

By applying the superconducting material to the multiconnection substrate of bonded fibers, multiple independent connections are produced which reduce the effect of flux jumping. Flux jumping occurs when the magnetic flux penetrating the conductor becomes dislodged from its normal (pinning) sites. The large contact area of the superconducting material surrounded by coolant provides thermal stability. See Collings, *DESIGN AND FABRICATION OF CONVENTIONAL AND UNCONVENTIONAL SUPERCONDUCTORS*, Noyes publications, Parkridge, New Jersey, 1984 for a description of these phenomena.

The superconductive material which can be used for the present invention, and which has a critical temperature of superconductivity at or above the boiling point of liquid nitrogen, are: $RBa_2Cu_3O_{7-x}$ where are R is yttrium or another lanthanide rare earth, and x is number from 0 to 1 for example LaBaCuO, and LaCaCuO. $YBa_2Cu_3O_7$ and $YBa_2Cu_3O_6.9$ are particularly advantageous as the superconducting material.

In general, examples of how a ceramic, including the superconducting ceramic identified above can be deposited on a porous fiber preform, are disclosed in U.S. Pat. No. 4,092,194 to Green (a sol-gel process); U.S. Pat. No. 4,552,786 to Bernburg et al (deposition from a precursor laden fluid, including the use of super critical fluid); and U.S. Pat. No. 4,580,524 to Lackey, Jr. et al (chemical vapor deposition).

These three patents are incorporated here by reference to illustrate methods which the skilled artisan can use to deposit ceramic material and specifically the superconductive material used in accordance with the present invention, in the porous substrate of bonded fibers which are also used in the present invention.

To use the sol-gel process, an aqueous solution suspension, dispersion, slurry, emulsion or the like which contains particles of one or more oxides or oxide compounds, a precursor of such an oxide or oxide compound or both is prepared. The oxides or precursors are of the superconducting material to be utilized.

The coating composition is uniformly distributed around the fibers of the substrate. The distribution is affected by the viscosity of the coating composition and the method of application. The composition must have a viscosity that is low enough to permit flow and some penetration into the voids of the substrate.

The substrate, with the coating composition therein, is then dried, for example, by heating, and fired to set the composition or transform the precursors into the final superconducting material.

Other known techniques can be used as well such as the chemical vapor deposition technique of the Lackey, Jr. et al. patent.

The invention claimed is:

1. A superconducting electrical conductor, comprising:
   an elongated porous substrate of sintered bonded ceramic fibers;
   a coating of ceramic oxide superconducting material on fibers of said substrate;
   an inner tube around said coated substrate with an outer tube surrounding said inner tube, said outer tube defining an annular space with said inner tube which is adapted to be evacuated for producing a thermal barrier, and a layer of electrical and heat insulation on an outer surface of said outer tube; and
   means for supplying a cryogenic fluid through said substrate for cooling said superconducting material to or below its critical temperature of superconductivity.

2. A superconducting electrical conductor, according to claim 1 wherein said ceramic fibers comprise aluminosilicate, said ceramic fibers being bound by a blend of silica powder and boron nitride powder which are sintered together to bind the fibers.

3. A superconducting electrical conductor, according to claim 1 wherein in superconducting material is selected from the group having the chemical formula $RBa_2Cu_3O_{7-x}$, where R is a member selected from the group consisting of yttrium or a lanthanide rare earth, and x is a number from 0 to 1.

4. A superconducting electrical conductor according to claim 1 wherein said superconducting material is LaBaCuO.

5. A superconducting electrical conductor according to claim 1 wherein the conductor is shaped to form one or more coils.

6. A superconducting electrical conductor according to claim 1 wherein said superconducting material is LaCaCuO.

7. A superconducting electrical conductor assembly, comprising:
    an elongated porous substrate of sintered bonded ceramic fibers;
    a coating of ceramic oxide superconducting material on fibers of said substrate;
    an inner tube around said coated substrate with an outer tube surrounding said inner tube, said outer tube defining an annular space with said inner tube which is adapted to be evacuated for producing a thermal barrier, and a layer of electrical and heat insulation on an outer surface of said outer tube;
    means for supplying a cryogenic fluid through said substrate for cooling said superconducting material to or below its critical temperature of superconductivity; and
    at least one joint connector for connecting one length of said substrate with superconducting material coated therein with another length thereof, said joint connector having a plurality of slender elongated rods extending parallel to each other and being spaced from each other, said rods having a coating of ceramic oxide superconducting material thereon, and a perforated frame connected to and supporting said rods in their spaced parallel orientation whereby one end of said rods is insertable into an open end of a substrate for connecting said rods to said substrate.

8. A superconducting electrical conductor assembly according to claim 7 wherein said means for supplying cryogenic fluid comprises a source of cryogenic fluid, a pipe connecting said source of cryogenic fluid to said inner tube for supplying cryogenic fluid to the interior of said inner tube and to said porous substrate, and at least one vent connected to said inner tube at a spaced location from said pipe for venting cryogenic fluid from said inner tube.

9. A superconducting electrical conductor assembly according to claim 8 including means for grounding the assembly electrically connected between said inner tube and earth.

10. A method of producing a superconducting electrical conductor comprising the steps of:
    sintering a multiplicity of ceramic fibers together to form a porous substrate of bonded fibers;
    coating a ceramic oxide superconducting material on the fibers of the substrate;
    surrounding the coated substrate with first an inner tube and then an outer tube to define an annular space with the inner tube to provide for evacuation so as to produce a thermal barrier therein;
    placing electrical and heat insulation on an outer surface of the outer tube; and
    supplying a cryogenic liquid to the interior of the inner tube for cooling the superconducting material to its critical temperature of superconductivity.

11. A method according to claim 10 further comprising the steps of:
    positioning a supply of cryogenic fluid above the outer tube at a location along the tube;
    supplying cryogenic fluid from the source by gravity into the inner tube; and
    venting the cryogenic material at a spaced location from the source in a low flow open percolation circuit.

12. A method according to claim 11 further comprising the step of providing quench protection at intervals along the superconducting electrical conductor.

13. A method according to claim 10 wherein the step of coating includes applying the superconducting material to the substrate epitaxially.

* * * * *